United States Patent [19]

Abe

[11] Patent Number: 4,843,262

[45] Date of Patent: Jun. 27, 1989

[54] PULL UP OR PULL DOWN ELECTRONIC DEVICE

[75] Inventor: Yoshihiro Abe, Atsugi, Japan

[73] Assignee: Canon Kabushiki Kaisha, Tokyo, Japan

[21] Appl. No.: 80,011

[22] Filed: Jul. 31, 1987

[30] Foreign Application Priority Data

Aug. 7, 1986 [JP] Japan .................................. 61-185976

[51] Int. Cl.⁴ ......................................... H03K 19/094
[52] U.S. Cl. .................................... 307/475; 307/443; 307/448; 307/550; 307/296.8
[58] Field of Search ............... 307/200 A, 200 B, 443, 307/448, 468, 473, 475, 549, 550, 584, 585, 270, 297

[56] References Cited

U.S. PATENT DOCUMENTS

| | | | |
|---|---|---|---|
| 3,906,255 | 9/1975 | Mensch Jr. | 307/448 |
| 4,031,456 | 6/1977 | Shimada et al. | 307/297 X |
| 4,479,067 | 10/1984 | Fujita | 307/448 X |
| 4,567,575 | 1/1986 | Morihisa et al. | 307/475 X |
| 4,581,551 | 4/1986 | Campbell Jr. | 307/475 |
| 4,591,742 | 5/1986 | Morito | 307/448 X |

OTHER PUBLICATIONS

Baitinger et al., "Constant-Current Source Network", IBM T. D. B., vol. 13, No. 9, Feb. 1971, p. 2516.

Primary Examiner—David Hudspeth
Attorney, Agent, or Firm—Fitzpatrick, Cella, Harper & Scinto

[57] ABSTRACT

An electronic device with an output terminal to be pulled up or down to a predetermined potential has a constant current circuit for use in pulling up or down the output terminal.

12 Claims, 2 Drawing Sheets

PULL UP OR PULL DOWN ELECTRONIC DEVICE

BACKGROUND OF THE INVENTION

1. Field of the Invention

The present invention relates to an electronic device, and more particularly to an electronic device of the type whose output terminal voltage is pulled up or down.

2. Related Background Art

An example of a conventional pull-up circuit is shown in FIGS. 4A and 4B. In FIG. 4A, a pull-up circuit with an input terminal Vin and an output terminal Vout is made of a p-channel MOS transistor 8 whose gate is grounded. As the input Vin changes from 0 to Vdd, current Id drained from the pull-up circuit changes from Idd to 0 as shown in FIG. 5A. In a pull-up circuit shown in FIG. 4B, current Id drained from the pull-up circuit or a resistor of high resistance value changes as shown in FIG. 5B. If such a pull-up circuit is applied to an input-output circuit of an electronic device made of, for example, ICs as shown by A in FIG. 6, the voltage at terminal 25 becomes low level when one of open-drain transistor 21 and 22 becomes turned on, and high level when both of them are turned off.

In order to attain low power consumption, the on-resistance of the pull-up circuit when one of the open-drain transistors 21 and 22 becomes turned on is designed to have a large value to suppress the drainage of current from the pull-up circuit. However, a problem arises that with a large on-resistance, a time constant becomes large and the circuit response becomes slow, the time constant being defined by the on-resistance and a capacitor indicated by a broken line and coupled to terminal 25. This problem is a burden on such a pull-up circuit that a high speed response as well as low power consumption is required. Further, as shown in FIGS. 5A and 5B, since the frequency characteristics vary with the level of Id which changes depending upon the magnitude of Vin, there arises a problem of generating waveform distortion of an input/output signal.

SUMMARY OF THE INVENTION

It is an object of the present invention to obviate the above problems.

In order to solve the above problems, according to the embodiment of the present invention, a constant current circuit is used as a pull-up or pull-down circuit for an output terminal of an electronic device which is to be pulled up or down to a predetermined potential.

With the above construction, since the pull-up or pull-down is effected by the use of a constant current circuit, the frequency characteristics of an output signal relative to an input signal become stable and an overall response performance can be improved.

Other objects of the present invention will become apparent from the following description when read in conjunction with the accompanying drawings.

DETAILED DESCRIPTION OF THE PREFERRED EMBODIMENTS

Figure 1A:
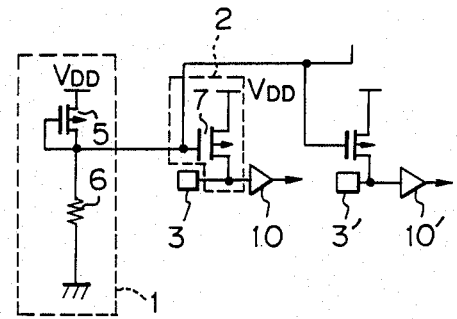
FIG. 1A is a circuit diagram showing a first embodiment of the present invention.

FIG. 1A is a circuit diagram showing an example of an electronic device according to the present invention. In the Figure, a reference voltage circuit 1 is composed of a metal insulator semiconductor type p-channel FE (MISFET) 5 and a resistor 6. The reference voltage is defined by a power supply voltage Vdd and a gate-source voltage Vgs of MISFET 5.

Figure 6:
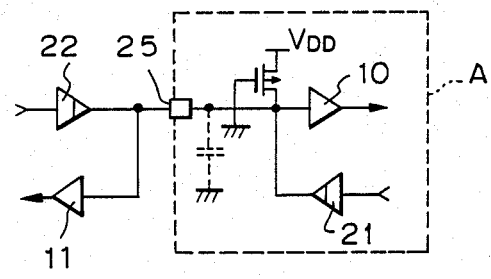
FIG. 6 is a circuit diagram showing an electronic device A with a conventional pull-up circuit.

A pull-up circuit 2 is composed of a p-channel MISFET 7 whose gate is applied with an output voltage from the reference voltage circuit 1. Input/output terminals 3, 3' requiring a pull-up current are connected to an external circuit (not shown) in a similar manner as of terminal 25 shown in FIG. 6.

With the construction as above, assuming that a power supply voltage is Vdd and an input voltage across the gate and source of MISFET 7 is Vgs, MISFET 7 constituting the pull-up circuit becomes saturated if a voltage Vin at terminal 3 is within a range of $0 \leq Vin \leq Vdd - Vgs$. In this case, an output current from the pull-up circuit, i.e., a pull-up current I becomes constant as $I = (\beta/2) \cdot (Vgs - Vth)^2$, wherein Vgs and Vth are a gate-source voltage and threshold value, respectively of MISFET 7. $\beta$ is given by:

$$\beta = W/L \cdot \mu \cdot Cox$$

where L is a channel length of MISFET, W is a channel width of MISFET, $\mu$ is a mobility, and Cox is a unit gate capacitance.

Figure 2:
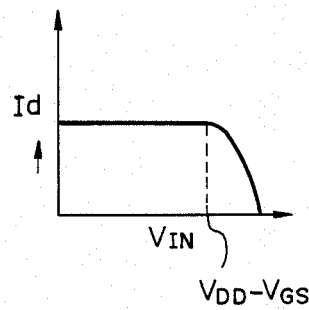
FIG. 2 shows the characteristic of the embodiment shown in FIG. 1A.

A relation between a voltage at terminal 3 and a current flowing through the pull-up circuit is shown in FIG. 2.

As seen from FIG. 2, a current flowing through termina 3 exhibits constant current characteristics within a voltage Vin range of $0 \leq Vin \leq Vdd - Vgs$. Thus, in this embodiment, even if a voltage at terminal 3 is low, power consumption can be made small. Also, a pull-up circuit with a quick response can be realized.

Figure 3:
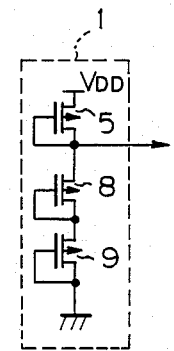
FIG. 3 is a circuit diagram showing another embodiment of the reference voltage circuit 1 shown in FIG. 1.
Figure 4A:
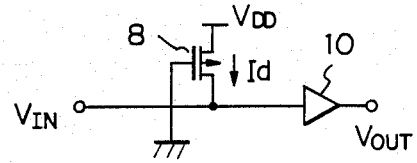
FIGS. 4A and 4B are circuit diagrams showing conventional pull-up circuits.
Figure 4B:
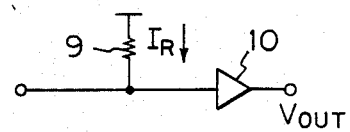
Figure 5A:
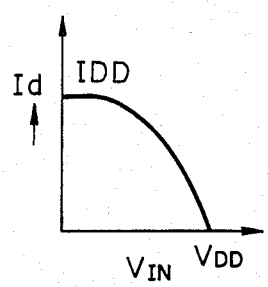
FIGS. 5A and 5B are graphs showing the characteristics of the conventional pull-up circuits shown in FIGS. 4A and 4B, respectively.
Figure 5B:
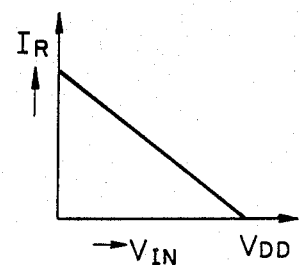

The voltage reference circuit 1 shown in FIG. 1 may be constructed as shown in FIG. 3, wherein MISFETs 8 and 9 are constructed similar to MISFET 5. Advantageously, this circuit construction can be implemented easily using the semiconductor integration process.

A p-channel MISFET has been used in the above embodiment to form a pull-up circuit. A pull-down circuit with a same circuit arrangement can be made using an n-channel MISFET.

Figure 1B:
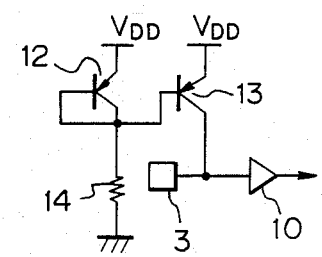
FIG. 1B is a circuit diagram showing a second embodiment of the present invention.

A pull-up circuit using a MISFET has been described in the above embodiment. However, the present invention may be embodied using a bipolar transistor, a transistor of another type, a diode or the like, as in the second embodiment shown in FIG. 1B. In FIG. 1B, a constant voltage circuit is composed of a PNP transistor 12 and a resistor 14, and a constant current circuit is composed of a PNP transistor 13.

In this embodiment with a constant current circuit composed of a bipolar transistor, a change in current (so-called Early effect) however occurs due to base width modulation dependent of a voltage Vin (Vce). Therefore, the first embodiment with a constant current circuit composed of a MISFET has a better linearity of an output level relative to an input signal level.

This Early effect can be suppressed with a smaller Hfe, compromising with an increase in current consumed by the voltage circuit. In view of this, it is better to realize a pull-up constant current circuit of this invention by using an FET as shown in FIG. 1A.

As described so far, since active elements such as transistors are used in the embodiments of this invention to form a constant current circuit, an improved linearity and superior input/output characteristics can be obtained. Obviously, non-linear elements such as diodes may be used.

As seen from the foregoing description of the embodiment, an electronic device can be achieved which can pull up or down an output terminal with a low power consumption and a quick response.

What is claimed is:

1. An electronic device comprising:
a voltage source of a predetermined potential;
first constant current means comprising a first field effect transistor coupled so that it operates within a saturation range; and
an output terminal connected to said voltage source through said first constant current means said output terminal being pulled up or down to the predetermined potential, in response to said first constant current means.

2. An electronic device according to claim 1, further comprising a second constant current means connected to a gate of said first field effect transistor.

3. An electronic device according to claim 2, wherein said second constant current means includes a transistor and a resistor element.

4. An electronic device according to claim 3, wherein said transistor of said second constant current means is a second field effect transistor.

5. An electronic device according to claim 4, wherein said first field effect transistor and said second field effect transistor have the same channel conductivity type.

6. An electronic device according to claim 3, wherein said resistor element comprises a third field effect transistor.

7. An input/output circuit for either receiving an input from or providing an output signal to an external circuit, said input/output circuit comprising:
(a) an input and/or output terminal selectively connected to the external circuit;
(b) a first circuit element connected to said input and/or output terminal and providing a second input and/or output terminal; and
(c) a first constant current means connected to said input and/or output terminal wherein said first constant current means comprises a first field effect transistor coupled so that it operates within a saturation range.

8. An input/output circuit according to claim 7, further comprising a second constant current means connected to a gate of said first field effect transistor.

9. An input/output circuit according to claim 8, wherein said second constant current means includes a transistor and a resistor element.

10. An input/output circuit according to claim 9, wherein said transistor of said second constant current means is a second field effect transistor.

11. An input/output circuit according to claim 10, wherein said first field effect transistor and said second field effect transistor have the same channel conductivity type.

12. An input/output circuit according to claim 9, wherein said resistor element comprises a third field effect transistor.

* * * * *